(12) United States Patent
Ota et al.

(10) Patent No.: US 10,218,337 B2
(45) Date of Patent: Feb. 26, 2019

(54) SEMICONDUCTOR DEVICE AND ELECTRONIC APPARATUS

(71) Applicant: CANON KABUSHIKI KAISHA, Tokyo (JP)

(72) Inventors: Yasuharu Ota, Kawasaki (JP); Yasushi Matsuno, Fujisawa (JP); Takashi Muto, Kawasaki (JP); Daisuke Yoshida, Ebina (JP)

(73) Assignee: Canon Kabushiki Kaisha, Tokyo (JP)

(*) Notice: Subject to any disclaimer, the term of this patent is extended or adjusted under 35 U.S.C. 154(b) by 56 days.

(21) Appl. No.: 15/413,104

(22) Filed: Jan. 23, 2017

(65) Prior Publication Data
US 2017/0222632 A1 Aug. 3, 2017

(30) Foreign Application Priority Data
Jan. 29, 2016 (JP) .................. 2016-016448

(51) Int. Cl.
H03K 3/12 (2006.01)
H03K 3/037 (2006.01)
H01L 23/528 (2006.01)
H01L 27/092 (2006.01)
H03G 3/30 (2006.01)
H03K 3/013 (2006.01)
H03K 19/003 (2006.01)

(52) U.S. Cl.
CPC ......... H03K 3/037 (2013.01); H01L 23/5283 (2013.01); H01L 27/092 (2013.01); H03G 3/30 (2013.01); H03K 3/013 (2013.01); H03K 19/00346 (2013.01)

(58) Field of Classification Search
None
See application file for complete search history.

(56) References Cited

U.S. PATENT DOCUMENTS

| 5,061,937 | A | * | 10/1991 | Ozeki | ............... | H01Q 3/22 342/368 |
| 5,136,358 | A | | 8/1992 | Sakai | | |
| 5,182,625 | A | | 1/1993 | Miyake | | |
| 7,486,126 | B2 | | 2/2009 | Shimazaki | | |
| 7,990,440 | B2 | | 8/2011 | Kobayashi | | |
| 8,023,025 | B2 | | 9/2011 | Itano | | |
| 8,482,645 | B2 | | 7/2013 | Takatsuka | | |
| 9,571,771 | B2 | | 2/2017 | Sanada | | |

(Continued)

FOREIGN PATENT DOCUMENTS

| EP | 2627078 A2 | 8/2013 |
| EP | 2750376 B1 | 12/2016 |

(Continued)

Primary Examiner — Cassandra Cox
(74) Attorney, Agent, or Firm — Canon U.S.A., Inc. IP Division

(57) ABSTRACT

A semiconductor device provides a plurality of circuit units arranged in parallel. Each of the plurality of circuit units includes a first signal line that transmits a first signal, which is an analog signal; a sending unit that sends a second signal; a receiving unit that receives the second signal; and a second signal line that transmits the second signal from the sending unit to the receiving unit. The distance between the first and second signal lines is shorter than the pitches at which the plurality of circuit units is arranged. The second signal is a pulse signal.

20 Claims, 8 Drawing Sheets

(56) References Cited

U.S. PATENT DOCUMENTS

| | | | | |
|---|---|---|---|---|
| 2002/0149405 A1* | 10/2002 | Makino | ................... | G06F 1/10 |
| | | | | 327/141 |
| 2009/0033155 A1 | 2/2009 | Kanno | | |
| 2010/0246152 A1* | 9/2010 | Lin | ..................... | H01L 21/563 |
| | | | | 361/783 |
| 2016/0072443 A1* | 3/2016 | Mizokami | ............... | H03F 1/565 |
| | | | | 330/295 |
| 2016/0088244 A1 | 3/2016 | Yamazaki | | |

FOREIGN PATENT DOCUMENTS

| | | |
|---|---|---|
| JP | H0424965 A | 1/1992 |
| JP | H0442934 A | 2/1992 |
| JP | 2007208364 A | 8/2007 |
| JP | 2007243912 A | 9/2007 |
| JP | 2008042238 A | 2/2008 |
| JP | 2008263072 A | 10/2008 |
| JP | 2009016776 A | 1/2009 |
| JP | 2009141528 A | 6/2009 |
| JP | 2011216969 S | 10/2011 |
| JP | 2013179577 A | 9/2013 |
| JP | 2014075507 A | 4/2014 |
| JP | 2014078901 A | 5/2014 |
| JP | 2014131146 A | 7/2014 |
| JP | 2015046834 A | 3/2015 |

* cited by examiner

SEMICONDUCTOR DEVICE AND ELECTRONIC APPARATUS

BACKGROUND OF THE INVENTION

Field of the Invention

The present technology relates to a semiconductor device.

Description of the Related Art

A parallel circuit in which equivalent circuit units are arranged is used in semiconductor devices. An amplification portion and a comparison portion connected as a parallel circuit are described in Japanese Patent Laid-Open Nos. 2014-131146 and 2013-179577. In order to reduce the size of the parallel circuit or increase the number of the circuit units, a pitch between the circuit units or a width of the circuit unit needs to be reduced. Note that the width of the circuit unit is the same as or less than the pitch between the circuit units. Therefore, the width of the circuit unit reduces if the pitch between the circuit units reduces.

SUMMARY OF THE INVENTION

In an effort to solve the aforementioned disadvantages with the prior art, a semiconductor device is provided in which a plurality of circuit units are arranged in parallel. Each of the plurality of circuit units includes a first signal line that transmits a first signal, which is an analog signal; a sending unit that sends a second signal; a receiving unit that receives the second signal; and a second signal line that transmits the second signal from the sending unit to the receiving unit. The distance between the first and second signal lines is shorter than the pitches at which the plurality of circuit units is arranged. A sending circuit included in the sending unit outputs the second signal on the basis of an input signal transmitted to the sending circuit. The input signal is signal in which the signal level thereof changes. The second signal is a pulse signal that includes a pulse corresponding to the change of the input signal. The width of the pulse is shorter than the duration time of the signal level after the signal level of the input signal has changed.

Further features and aspects of the disclosure will become apparent from the following description of various example embodiments (with reference to the attached drawings).

DESCRIPTION OF THE EMBODIMENTS

If the pitch between the circuit units is reduced in a parallel circuit in which the equivalent circuit units are arranged used in semiconductor devices, the width of the circuit unit is reduced. As a result, the distance between the signal lines within the circuit unit and the distance between the signal lines between the circuit units are also reduced. As a result, crosstalk between the signal lines readily occurs.

The crosstalk between the signal lines is a phenomenon in which when the signal level of a signal line changes, an offset occurs to the signal level of a nearby signal line, corresponding to the coupling capacitance between the signal lines and the amount of change in the signal level of the signal line. The larger the coupling capacitance is, the larger the crosstalk becomes, and the shorter the distance between signal lines is, the larger the coupling capacitance becomes. That is, if a distance between signal lines becomes short, crosstalk becomes large.

A signal line that transmits an analog signal exists within a circuit unit, and if crosstalk caused from another signal line occurs with respect to the former signal line, the analog signal deteriorates. The other signal line may be a signal line within the same circuit unit as the signal line that transmits an analog signal, or may be a signal line within an adjacent circuit unit.

Here, the present embodiments and features thereof aim to provide a semiconductor device that reduces deterioration of an analog signal.

Figure 1A:
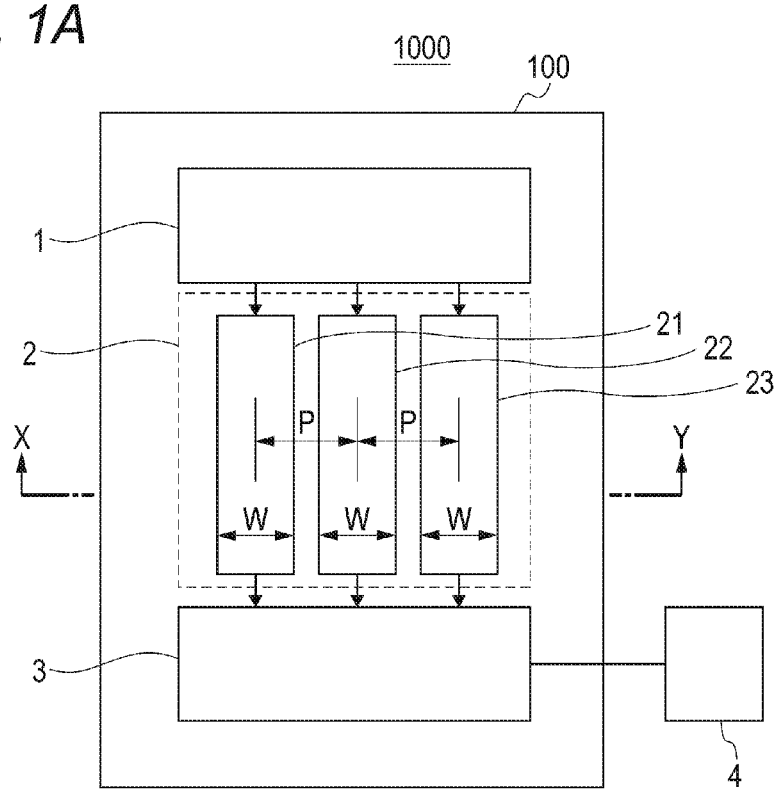
FIGS. 1A and 1B are schematic diagrams describing an example embodiment of a semiconductor device.

Hereinafter, the various features and embodiments of the disclosure will be described with reference to the drawings. Note that, in the description below and the drawings, common reference signs are used for common configurations described over a plurality of drawings. Therefore, the common configurations will be described by mutually referring to the plurality of drawings, and the description for the configuration with the common reference signs is properly omitted. FIG. 1A is a schematic plan diagram of an electronic apparatus 1000 that includes a semiconductor device 100. The semiconductor device 100 includes a parallel circuit unit 2 in which a plurality of substantially equivalent circuit units 21, 22, and 23 arranged in parallel. A preceeding circuit unit 1 inputs a signal to the parallel circuit unit 2, and the parallel circuit unit 2 outputs the signal to a latter circuit unit 3. FIG. 1A illustrates pitches P at which the plurality of circuit units 21, 22, and 23 is arranged, and widths W of the respective circuit units 21, 22, and 23. The width N is the same as or shorter than the pitches P (W≤P). The electronic apparatus 1000 includes an external device 4 that operates on the basis of an output signal output from the semiconductor device 100. The output signal output from the semiconductor device 100 may be an analog signal or a digital signal. The external device 4 may be a signal processing device, a memory device, or a display device. The electronic apparatus 1000 is, for example, an information terminal, a camera, or a music player.

Figure 1B:
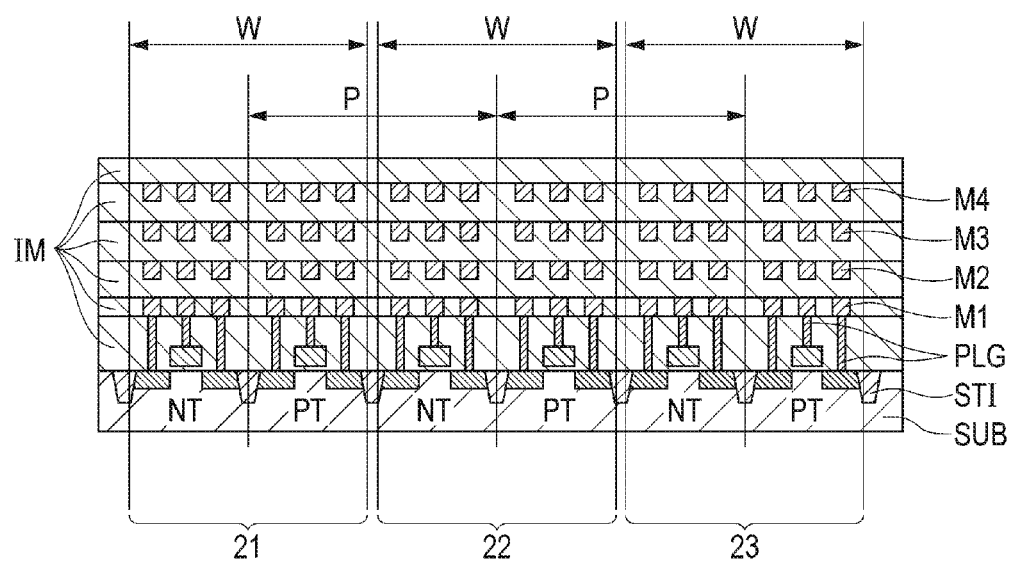

FIG. 1B is a schematic cross-sectional diagram of the parallel circuit unit 2 of the semiconductor device 100. A substrate SUB that includes an element isolation portion STI includes an n-type MOS transistor NT and a p-type MOS transistor PT. The source and the drain of each of the n-type MOS transistor NT and the p-type MOS transistor PT may include silicide areas. The gate of each of the n-type MOS transistor NT and the p-type MOS transistor PT may include a gate insulating film that has higher permittivity than a pure silicon oxide film. The physical film thickness of the gate insulating film can be 5 nm or less. A CMOS circuit can be configured with the n-type MOS transistor NT and the p-type MOS transistor PT. A plurality of wiring layers M1, M2, M3, and M4 is arranged on the substrate SUB via contact plugs PLG. The wiring layers M1, M2, M3, and M4 are Cu wiring having a damascene structure. Interlayer insulation layers IM and diffusion prevention layers (not illustrated) are arranged around the wiring layers M1, M2, M3, and M4. Each circuit includes the n-type MOS transistor NT and the p-type MOS transistor. Each signal line may be configured by at least any of the contact plug PLC and the wiring layers M1, M2, M3, and M4.

Figure 2A:
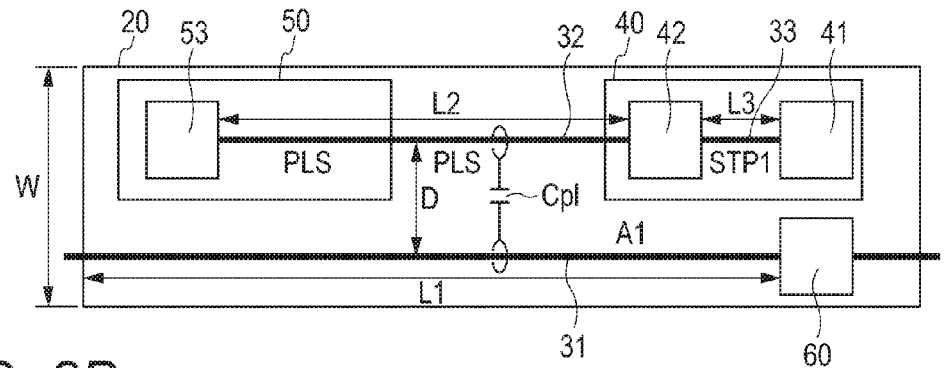
FIGS. 2A to 2D are schematic diagrams describing example embodiments of the semiconductor device.
Figure 2B:
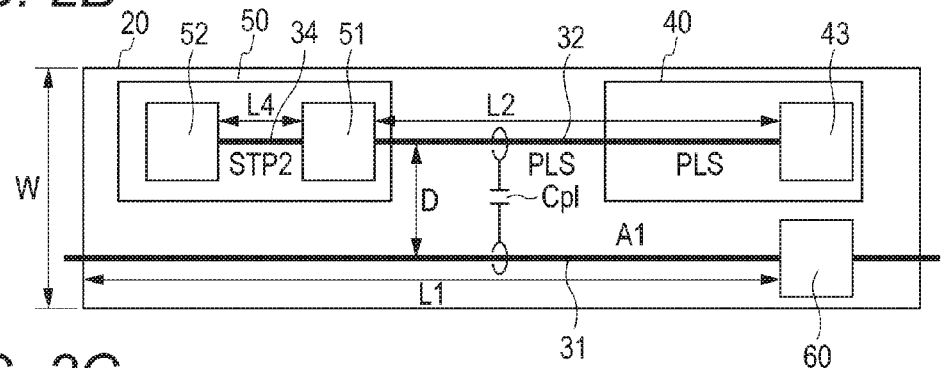
Figure 2C:
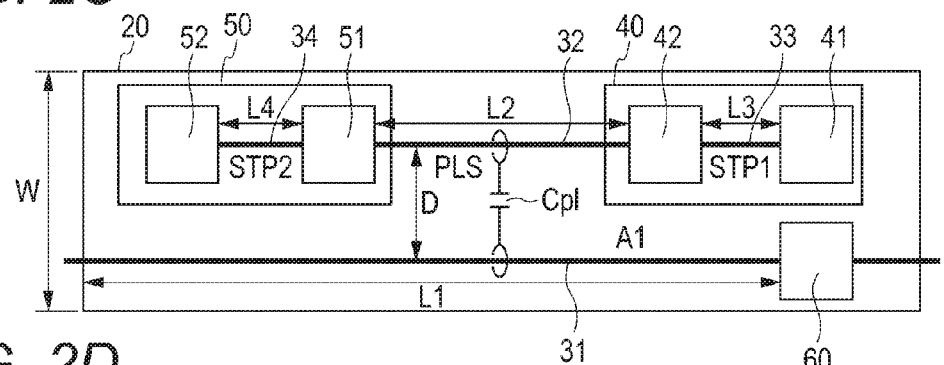

FIGS. 2A to 2C illustrate schematic diagrams of circuit units 20 included in a parallel circuit. Each of the structures illustrated as the circuit unit 20 in FIGS. 2A to 2D is common to each of the plurality of circuit units 21, 22, and 23 illustrated in FIGS. 1A and 1B. The circuit unit 20 includes a signal line 31, a signal line 32, a sending unit 40, and a receiving unit 50. The signal line 31 transmits an analog signal A1 or A2. The sending unit 40 sends a pulse signal PLS. The receiving unit 50 receives the pulse signal PLS. The signal line 32 transmits the pulse signal PLS from the sending unit 40 to the receiving unit 50. The sending unit 40 may include an output circuit 41 or 43. The output circuit 41 outputs a signal that is a source of the information included in the pulse signal PLS. The receiving unit 50 may include an input circuit 52 or 53. A signal corresponding to the information included in the pulse signal PLS is input to the input circuit 52. The pulse signal PLS is a signal that associates an operation of the output circuit 41 and an operation of the input circuit 52. However, the output circuit 41 or 43 as well as the input circuit 52 or 53 can also be arranged outside the circuit unit 20.

Each of the circuit units 20 can include a processing unit 60 in which the signal line 31 is connected to an input terminal of the processing unit 60. The processing unit 60 can perform predetermined processing to analog signal A1 that has been transmitted by the signal line 31. The predetermined processing refers to arithmetic operations such as amplification, comparison, addition, or calculus.

A distance D between the signal lines 31 and 32 is shorter than the pitches P at which the plurality of circuit units 20 is arranged (D<P). This is because the distance D is shorter than the width W (D<W), and the width W is the same as or shorter than the pitches P (W≤P). The distance D is sufficiently shorter than the whole of the parallel circuit unit 2 as illustrated. As a result, a coupling capacitance Cpl that may influence the transmission of the analog signal A1 is formed between the signal lines 31 and 32.

FIGS. 2A to 2D illustrate interconnection lengths L1 of the signal lines 31, and interconnection lengths L2 of the signal lines 32. In these examples, the interconnection length L1 is longer than the pitch P and the width W (L1>P≥W). Also, the interconnection length L2 is longer than the pitch P and the width W (L2>P≥W). As a result, the influence on the signals caused by the coupling capacitance is notable between the signal lines 31 and 32 compared with between other signal lines that have interconnection lengths shorter than the pitch P and the width W. The influence caused by the coupling capacitance may be larger on the signal line 31 than on the signal line 32, and the probability thereof is higher when the interconnection L1 longer than the interconnection length L2 (L1>L2) than in the case of the other way around. (L1<L2).

Also, each of the signal lines 31 and 32 is at least partially extending along a direction intersecting (in this example, the direction orthogonal to) a direction in which the circuit units 20 are arranged. Therefore, it can be said that the signal line 31 is arranged in parallel with the signal line 32 along the direction intersecting the direction in which the circuit units 20 are arranged. The influence caused by the coupling capacitance Cpl becomes readily notable when the signal lines 31 and 32 are arranged in parallel as mentioned.

In a first embodiment illustrated in FIG. 2A, a sending unit 40 includes a sending circuit 42 that outputs a pulse signal PLS on the basis of a step signal STP1 that is an input signal input from an output circuit 41. The output circuit 41 outputs the step signal STP1 as a result of a predetermined operation. An input circuit 53 can perform a predetermined operation on the basis of the pulse signal PLS input to the input circuit 53.

In a second embodiment illustrated in FIG. 2B, a receiving unit 50 includes a receiving circuit 51 that outputs a step signal STP2 as an output signal to an input circuit 52 on the basis of a pulse signal PLS. An output circuit outputs the pulse signal PbS as a result of a predetermined operation. The input circuit 52 can perform a predetermined operation on the basis of the step signal STP2 input to the input circuit 52.

In a third embodiment illustrated in FIG. 2C, a sending unit 40 includes the output circuit 41 and the sending circuit 42, and a receiving unit 50 includes the receiving circuit 51 and the input circuit 52.

Figure 2D:
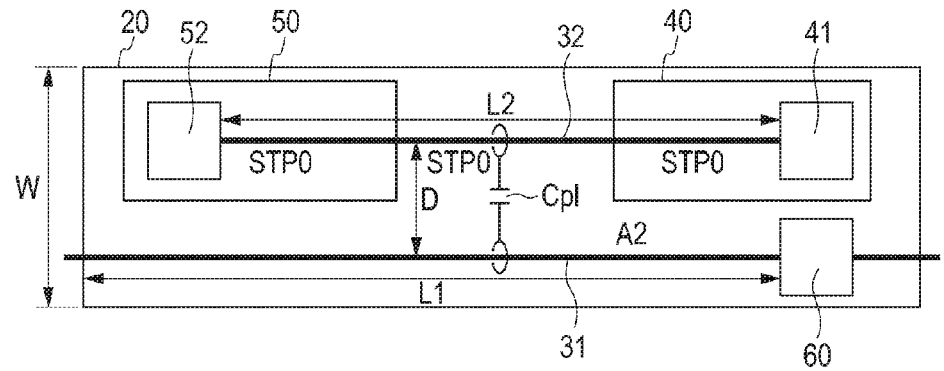

In a comparative embodiment illustrated in FIG. 2D, a sending unit 40 includes an output circuit 41, and a receiving unit 50 includes the input circuit 52. Note that in this comparative embodiment, the output circuit 41 outputs a step signal STP0 instead of a step signal STP1, and the step signal STP0, instead of the step signal STP2, is input to the input circuit 52. A signal line 32 transmits the step signal STP0.

Figure 3:
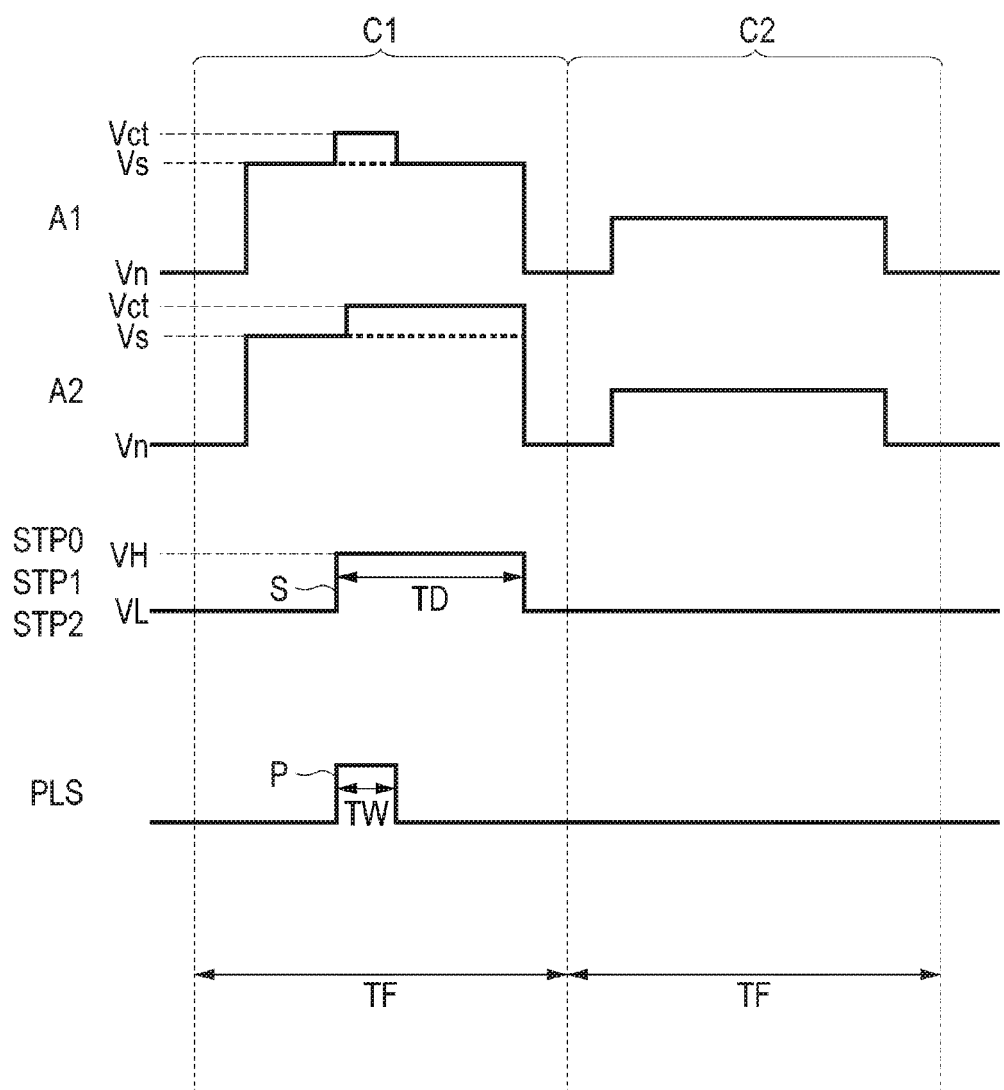
FIG. 3 is a schematic diagram describing the example embodiments of the semiconductor device.

FIG. 3 illustrates waveforms of the analog signal A1, the step signals STP0, STP1, and STP2, and the pulse signal PLS, and timing thereof. The analog signal A1 is a signal in which a crest value thereof indicates analog information. The step signals STP0, STP1, and STP2 are signals in which the signal levels thereof change before and after steps. The step is a general term for rising and falling of a waveform. When the waveform rises, the signal level changes from a first level VI, to a second level VH. When the waveform falls, the signal level changes from the second level VH to the first level VL. Note that the signal level of each of the step signals STP0, STP1, and STP2 may mutually be the same or different. Rising of the pulse of the pulse signal PLS corresponds to the rising timing of the step of each of the step signals STP1 and STP2. The pulse rises by using a step S as a trigger in this example. The step S is the rising of each of the step signals STP1 and STP2. The second level VH of each of the step signals STP1 and STP2 will be focused on here. The second level VH is a signal level after the step S (rising) to which the pulse signal PLS corresponds. FIG. 3 illustrates duration time TD of the second level VH. Each of the step signals STP0, STP1, and STP2 is a pulse signal that has the duration time TD shorter than an operation frequency TF of the circuit unit 20 (TD<TF) in this example. Therefore, the duration time TD can also be called a pulse width of each of the step signals STP0, STP1, and STP2. The duration time TD may be the same as or longer than the operation frequency TF of the circuit unit 20 (TD≥TF). The pulse signal PLS has a pulse P, which has a pulse width TN. The pulse width TW is shorter than the duration time TD (TN<TD). The pulse width TN is shorter than the operation frequency TF (TN<TF) in this example. Note that each of the time of starting and ending points of the pulse width TW in rising and falling, s respectively defined as a point when each of the pulse height is a half of the crest value. In addition, in the description below, even if the change in the signal is delayed by a resistance, a capacitance, or she like, as long as the two phenomena mutually synchronize and change, the time at which these changes occur is regarded as the same.

As mentioned above, the step signal. STP1 is input into the sending circuit 42, and the sending circuit 42 outputs the pulse signal PLS. Therefore, the sending circuit 42 functions as a conversion circuit that converts step signal STP1 (pulse signal) having the long duration time TD (pulse width TD) to the pulse signal PLS having the short pulse width TW. Also, the pulse signal PLS is input into the receiving circuit 51, and the receiving circuit 51 outputs the step signal STP2. Therefore, the receiving circuit 51 functions as a conversion circuit that converts the pulse signal having the short pulse width TW to the step signal STP2 (pulse signal) having the long duration time TD (pulse width TD). A circuit capable of performing such conversion is achievable by various electronic circuits. For example, the sending circuit 42 can be configured with a monostable multi-vibrator circuit, especially, a one-shot pulse circuit. For example, the receiving circuit 51 can be configured with a bistable multi-vibrator circuit, especially, a latch circuit. Since the latch circuit can hold information that has been input and output the information, the latch circuit is allowed to lengthen the pulse width of the signal to be output longer than the pulse width of the signal that has been input. Each of the input circuits 52 of the receiving unit 50 in FIGS. 2B, 2C, and 2D is a control circuit that controls a switch on the basis of, for example, the step signals STP0 or STP2. The switch needs to be kept on or off for a certain period. In order to achieve this, the signal for controlling on and off of the switch needs to be the step signal that has the long duration time TD (pulse width TD).

FIGS. 2A to 2C illustrate signal lines 33, each of which connects the output circuit 41 and the sending circuit 42, and signal lines 34, each of which connects the receiving circuit 51 and the input circuit 52. The circuit unit 20 may include the signal line 33 and/or the signal line 34. FIGS. 2A to 2C also illustrate interconnection lengths L3 of the signal lines 33 and interconnection lengths L4 of the signal lines 34. If the interconnection length 53 is shorter than the interconnection length L2 (L3<L2), the coupling capacitance between the signal lines 33 and 31 is smaller than the coupling capacitance Cpl between the signal lines 31 and 32. If the interconnection length L4 is shorter than the interconnection length L2 (L4<L2), the coupling capacitance between the signal lines 34 and 31 is smaller than the coupling capacitance Cpl between the signal lines 31 and 32. Therefore, when the interconnection length L2 is longer than the interconnection lengths L3 and L4 (L2>L3 and L2>L4), compared with the case of the other way around (L2<L3 and L2<L4), the influence on the signal line 31 caused by the coupling capacitance is likely to be larger with the signal line 32 than with the signal lines 33 and 34.

FIG. 3 illustrates a waveform of the analog signal A1 of the first to third embodiments, and a waveform of an analog signal A2 of the comparative embodiment. Note that the dotted lines in the waveforms of the analog signals A1 and A2 in FIG. 3 illustrate the waveforms of the analog signals A1 and A2 in a case of assuming there is no influence from crosstalk. The signal level of the analog signal A1 is increased from a signal level Vs, which is the level when there is no crosstalk, to a signal level Vct. This is because the signal level is influenced by the crosstalk by the coupling capacitance Cpl for the period corresponding to the pulse width TN. The signal level of the analog signal A2 is also increased from the signal level Vs, which is the level when there is no crosstalk, to the signal level Vct. This is because the signal level is influenced by the crosstalk by the coupling capacitance Cpl for the period corresponding to the duration time TD. However, the analog signal A1 has a long period of acquiring the signal with no crosstalk or the signal in which the influence of crosstalk has been reduced, compared with the analog signal A2. Since the pulse width TW is shorter than the duration time TD, the period, after the influence from the crosstalk due to decrease in the signal level counteracts the influence from the crosstalk due to increase in the signal level, is longer in the analog signal A1 than in the analog signal A2. Therefore, the above period of the analog signal A1 is shorter than that of the analog signal A2. To be specific, the period is when an error occurs on the analog signal A1 due to the influence from the crosstalk by the coupling capacitance Cpl. As a result, the processing unit 60 is allowed to output accurate and stable signals over a long period. It is beneficial for increasing the accuracy of signal processing in the latter circuit unit 3 if the processing unit 60 is allowed to output accurate and stable signals over a long period. Note that crosstalk based on the pulse P, the STP0, the STP1, and the STP2 occurs, in the period C1 in FIG. 3, on the analog signals A1 and A2 because there are the pulse P, the STP0, the STP1, and the STP2. However, the crosstalk does not occur in the period C2 because the pulse P, the STP0, the STP1, and the STP2 are not output.

Especially, when the latter circuit unit 3 involves a counting operation such as A/D conversion, the accuracy of the A/D conversion increases by accurate and stable signals being input into the latter circuit unit 3 over a long period. As a result, the accuracy of the digital signal output from the semiconductor device 100 increases in a case where the analog signal is converted from analog to digital.

As described above, the semiconductor device that reduces deterioration of an analog signal can be provided by shortening the pulse width of the signal line 32 coupled to the signal line 31 that transmits the analog signal. It is notably effectual especially when the coupling capacitance Cpl between the signal lines 31 and 32 is large.

Note that the crosstalk mentioned above may occur not only between the signal lines within the circuit unit 20, but also between signal lines among adjacent circuit units. The crosstalk overlaps among a plurality of circuit units in a parallel circuit. As a result, the processing accuracy of the analog signal readily decreases. Therefore, reducing the crosstalk in the parallel circuit is effective for increasing the accuracy of signal processing.

EXAMPLE 1

Figure 4:
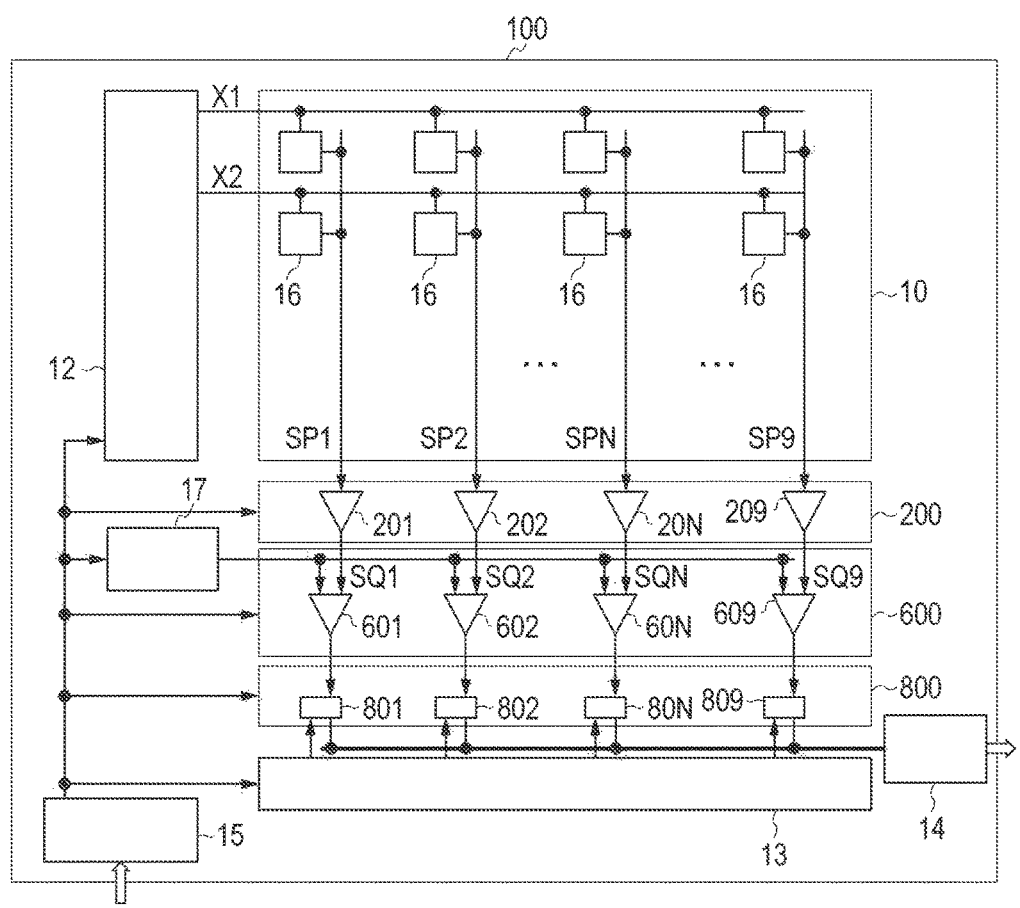
FIG. 4 is a schematic diagram describing Example 1 of the semiconductor device.

FIG. 4 is a diagram illustrating an example configuration of the semiconductor device 100 as a photoelectric conversion apparatus such as a CMOS image sensor. The semiconductor device 100 includes a pixel portion 10, an amplification portion 200, and a comparison portion 600 as illustrated in FIG. 4. The semiconductor device 100 further includes a memory unit 800, a vertical scanning unit 12, a horizontal scanning unit 13, a signal processing unit 14, a control unit 15, and a reference signal source 17. The control unit 15 controls the operation of the semiconductor device 100.

The pixel portion 10 includes a plurality of pixel circuits 16 arranged as a pixel array on a matrix. The plurality of pixel circuits 16 arranged on the same columns in the pixel portion 10 output pixel signals SP1, SP2, SPN, and SP9 to column signal lines from output nodes of the respective pixel circuits.

The amplification portion 200 includes a plurality of amplification units 201, 202, 20N, and 209. The amplification units 201, 202, 20N, and 209 amplify the signals SP1, SP2, SPN, and SP9 given from the corresponding signal lines.

The comparison portion 600 includes a plurality of comparison units 601, 602, 60N, and 609. The comparison units 601, 602, 60N, and 609 output the results of comparison between outputs from the corresponding amplification units 201, 202, 20N, and 209, and the reference signals given from the reference signal source 17.

The memory unit 800 includes a plurality of column memories 801, 802, 80N, and 809. The column memories 801, 802, 80N, and 809 hold count signals output from a counter circuit (not illustrated) by receiving outputs from the corresponding comparison units 601, 602, 60N, and 609.

When any column memory is selected from among the column memories 801, 802, 80N, and 809, the horizontal scanning unit 13 outputs a signal retained in the selected column memory to the signal processing unit 14.

The columns have functions to perform A/D conversion on the signals output through the amplification units from the pixel circuits 16 arranged on the same columns.

The configuration of the circuit unit 20 of the embodiments mentioned above can be applied to the amplification units 201, 202, 20N, and 209, the comparison units 601, 602, 60N, and 609, or the column memories 801, 802, 80N, and 809.

EXAMPLE 2

Figure 5A:
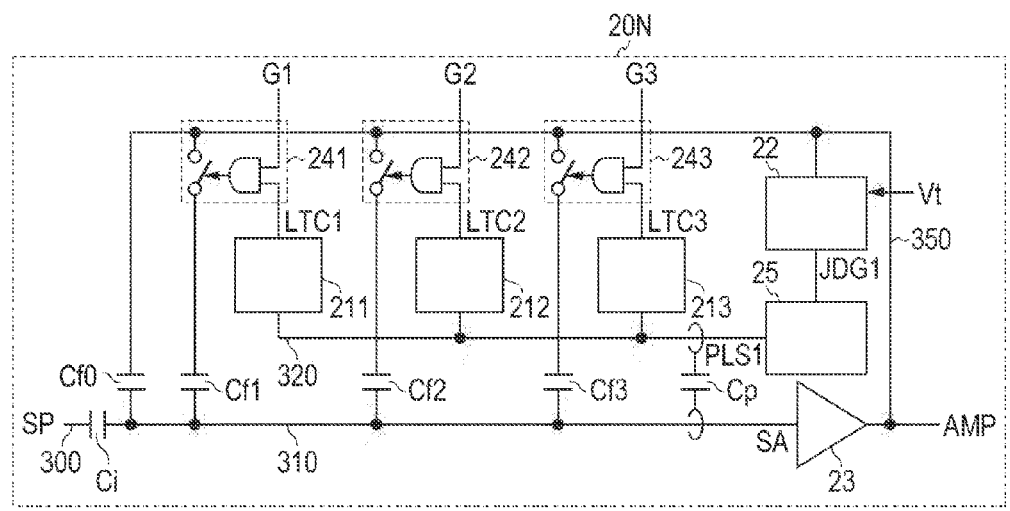
FIGS. 5A and 5B are schematic diagrams describing Example 2 of the semiconductor device.

FIG. 5A illustrates a configuration of a semiconductor device according to Example 2. Example 2 is an example of the amplification portion 200 in Example 1 to which the embodiments mentioned above are applied. FIG. 5A illustrates an example of the amplification unit 20N of the amplification portion 200 to which the present Example 2 is applied, but the present Example 2 can similarly be applied to the amplification units 201, 202, and 209.

The amplification unit 20N includes latch circuits 211, 212, and 213, a determination circuit 22, an amplifier 23, control circuits 241, 242, and 243, and a sending circuit 25. The determination circuit 22 corresponds to the output circuit 41 in FIGS. 2A to 2D. The sending circuit 25 corresponds to the sending circuit 42 in FIGS. 2A to 2D. The amplification unit 20N includes the determination circuit 22 and the sending circuit 25 as the sending unit in FIGS. 2A to 2D. Each of the latch circuits 211, 212, and 213 corresponds to the receiving circuit 51 in FIGS. 2A to 2D. Each of the control circuits 241, 242, and 243 corresponds to the input circuit 52 in FIGS. 2A to 2D. The amplification unit 20N includes a plurality of the receiving units in FIGS. 2A to 2D. To be specific, the amplification unit 20N includes a first receiving unit, a second receiving unit, and a third receiving unit. The first receiving unit includes the latch circuit 211 and the control circuit 241. The second receiving unit includes the latch circuit 212 and the control circuit 242. The third receiving unit includes the latch circuit 213 and the control circuit 243. The amplification unit 20N includes an amplification circuit that includes the amplifier 23 and capacitors Cf0, Cf1, Cf2, and Cf3. The amplification circuit corresponds to the processing unit 60 in FIGS. 2A to 2D. In addition, the amplification unit 20N includes signal lines 310 and 320 that respectively correspond to the signal line 31 and the signal line 32 in FIGS. 2A to 2D.

A pixel signal SF is input from the pixel circuit 16 via a signal line 300. The signal line 310 connected to the signal line 300 via a capacitor Ci transmits an analog signal SA based on the pixel signal SP. The analog signal SA transmitted by the signal line 310 is input to an input terminal of the amplifier 23.

The capacitor Cf0 is connected and feedback is applied between the input terminal and an output terminal of the amplifier 23. In addition, the capacitors Cf1, Cf2, and Cf3 selected by the control circuits 241, 242, and 243 can be connected between the input and output terminals of the amplifier 23. The control circuits 241, 242, and 243 control the switches connected to the capacitors Cf1, Cf2, and Cf3 to select connection or non-connection of the capacitors Cf1, Cf2, and Cf3.

When the capacitors Cf1, Cf2, and Cf3 are not connected with the output terminal of the amplifier 23 by the control circuits 241, 242, and 243, the capacitor Cf0 is connected as a feedback capacitance for the amplifier 23. As a result, the gain A of the amplification unit 20N becomes Ci/Cf0. Therefore, the pixel signal SP input from the signal line 300 is inverted and amplified with the gain A so that an amplification signal AMP can be output to the signal line 350.

On the other hand, when any of the capacitors Cf1, Cf2, and Cf3 is added as the feedback capacitance for the amplifier 23 by the control circuits 241, 242, and 243, the gain for the amplifier 23 becomes a gain B corresponding to the connection of the capacitors Cf1, Cf2, and Cf3. For example, if the capacitors Cf1 and Cf2 are connected, the gain B is Ci/(Cf0+Cf1+Cf2). Therefore, the pixel signal SP input from the signal line 300 is inverted and amplified with the gain B so that an amplification signal AMP can be output to the signal line 350.

A method of controlling the control circuits 241, 242, and 243 will be described. The determination circuit 22 is connected to the output terminal of the amplifier 23. The determination circuit 22 includes, for example, a comparator (not illustrated), and a threshold level Vt is input to the determination circuit 22. The determination circuit 22 compares the amplification signal AMP and the threshold level Vt. The determination circuit 22 determines whether the signal level of the amplification signal AMP is the threshold level Vt or more or less than the threshold level Vt, and outputs as a result of the comparison, a judging signal JDG1. The sending circuit 25 converts the judging signal JDG1 and outputs a pulse signal PLS1 to the signal line 320. The pulse signal PLS1 is transmitted to the latch circuits 211, 212, and 213 via the signal line 320.

The latch circuits 211, 212, and 213 latch the pulse signal PLS1 transmitted from the signal line 320 and hold the pulse signal PLS1 as control signals LTC1, LTC2, and LTC3. The latch circuits 211, 212, and 213 respectively output the control signals LTC1, LTC2, and LTC3 to the control circuits 241, 242, and 243.

The control circuits 241, 242, and 243 connect one end terminals of the capacitors Cf1, Cf2, and Cf3 to the output terminal of the amplifier 23 in accordance with the control signals LTC1, LTC2, and LTC3 and selection signals G1, G2, and G3. The control signals LTC1, LTC2, and LTC3 are signals for controlling connection and non-connection of the capacitors Cf1, Cf2, and Cf3. The selection signals G1, G2, and G3 are signals for selecting a capacitor to be connected from among the capacitors Cf1, Cf2, and Cf3.

Thus, the amplification unit 20N configures the amplification circuit with the amplifier 23 and the capacitors Cf0, Cf1, Cf2, and Cf3, and the control circuits 241, 242, and 243 control the gain of the amplification circuit. With this configuration, the signal level of the amplification signal AMP can be adjusted by switching the gain between A and B in accordance with the signal level of the pixel signal SP input to the signal line 300 from the pixel circuit 16.

Figure 5B:
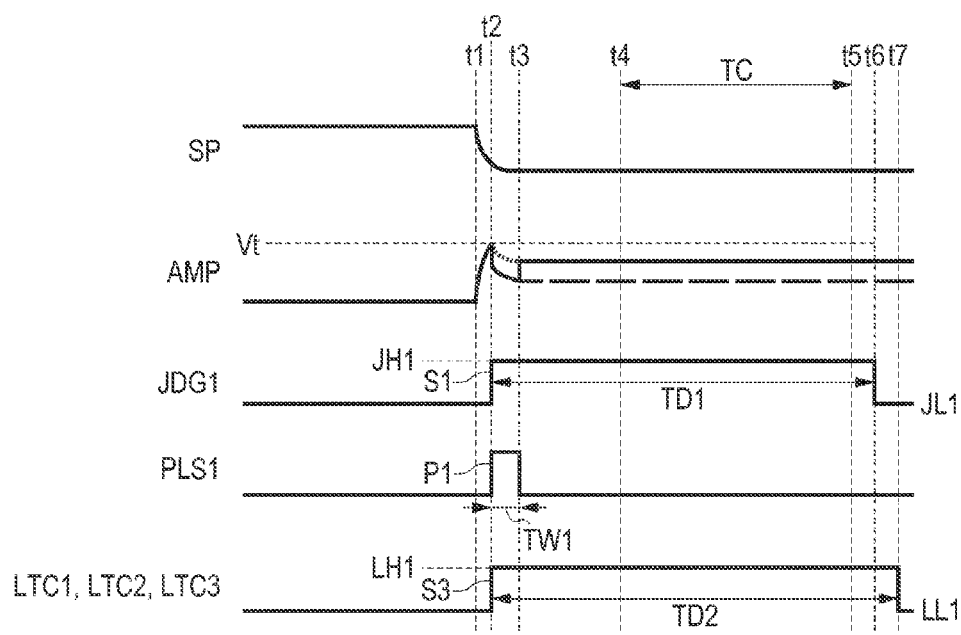

FIG. 5B is a timing chart illustrating the present example. FIG. 5B is the timing chart of the amplification signal AMP in a case of exceeding the threshold level Vt when the signal level of the pixel signal SP input to the signal line 310 is multiplied by the gain A in the present example.

A signal level corresponding the luminance of a pixel is input at time t1 to the signal line 300 that transmits the signal SP from the pixel. The signal level of the amplification signal AMP increases in accordance with the signal level of the pixel signal SP. When the signal level of the amplification signal AMP reaches the threshold level Vt at time t2, the determination circuit 22 outputs the judging signal JDG1 to the sending circuit 25. The judging signal JDG1 that is the output from the determination circuit 22 becomes a high level JH1 from a low level JL1 before an A/D conversion period TC, and the determination circuit 22 keeps the judging signal JDG1 at the high level JH1 during the A/D conversion period TC. After the A/D conversion period TC, the judging signal JDG1 becomes the low level JL1 from the high level JH1. A duration time TD1 of the high level JH1 of the judging signal JDG1 is from time t2 to t6. Note that if the signal level of the amplification signal AMP is less than the threshold level Vt, the determination circuit 22 keeps the judging signal JDG1 at the low level JL1, and the control circuits 241, 242, and 243 keep the gain at the original A.

The sending circuit 25 generates a pulse signal PLS1 that includes a judging pulse P1. The pulse signal PLS is generated by using a step S1 (rising), as a trigger, of the judging signal JDG1 in which the level becomes the high level JH1 from the low level JL1. A pulse width TW1 of the judging pulse P1 is a time from time t2 to time t3 that has synchronized with the step S1 (rising) of the judging signal JDG1 at time t2. The pulse width TW1 is shorter than the duration time TD1. The pulse signal PLS1 is transmitted to the latch circuits 211, 212, and 213 via the signal line 320.

The latch circuits 211, 212, and 213 latch the judging pulse P1 when the judging pulse P1 is input at time t2. The latch circuits 211, 212, and 213 output, even after time t3, the control signal LTC1, LTC2, and LTC3 that hold the signal level input at time t2. A duration time TD2 of a high level LH1 from a step S3 of the control signals LTC1, LTC2, and LTC3, is longer than the pulse width TW1. The control circuits 241, 242, and 243 lower the gain for the amplifier 23 from A to B by the judging signal JDG1 being input as the control signals LTC1, LTC2, and LTC3 to the control circuits 241, 242, and 243.

The pulse signal PLS1 input to the signal line 320 causes crosstalk on the analog signal S by a coupling capacitance Cp. As a result, the signal level of the amplification signal AMP, which is the output of the amplifier 23 to which the analog signal S has been input, decreases at time t2 and increases at time t3 in accordance with the change in the signal level of the pulse signal PLS1. For example, the signal level of the amplification signal AMP shows a steep (roughly vertical) decrease at time t2 and shows a steep (roughly vertical) increase at time t3. Here, the decrease and the increase in the signal level of the amplification signal AMP by the crosstalk are almost equal. As a result, the influences on the signal level counteract each other. Therefore, the signal level of the amplification signal AMP becomes statically determinate to a signal amplified by the desired gain B before the A/D conversion period TC, which is from time t4 to time t5.

The dotted line in the waveform of the amplification signal AMP in FIG. 5B illustrates the waveform of the amplification signal AMP in a case of assuming there is no influence from crosstalk. In addition, the broken line in the waveform of the amplification signal AMP in FIG. 5B illustrates the waveform of the amplification signal AMP in a case of assuming the signal line 320 transmits the judging signal JDG1 instead of the pulse signal PLS1. When the sending circuit 25 and the latch circuits 211, 212, and 213 are not used, the signal line 320 transmits the judging signal JDG1 instead of the pulse signal PLS1. In the present embodiments, the pulse width TW1 of the judging pulse P1 is shorter than the duration time TD1 of the high level JH1 of the judging signal JDG1. Therefore, the period during which a large error occurs in the amplification signal AMP by the influence from the crosstalk is shorter when the signal line 320 transmits the pulse signal PLS1 than when the signal line 320 transmits the judging signal JDG1. Therefore, when the period during which the error occurs finishes before the A/D conversion period TC starts, the more accurate amplification signal AMP can be output during the A/D conversion period TC than in a case of transmitting the judging signal JDG1. High speed amplification processing is also possible, since the period until the amplification signal AMP becomes statically determinate is shortened.

Figure 6A:
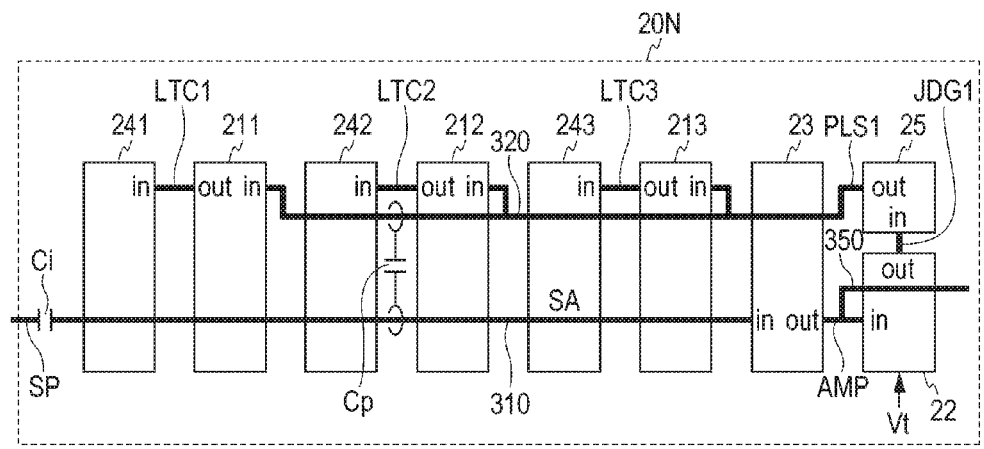
FIGS. 6A and 6B are schematic diagrams describing Example 2 of the semiconductor device.

FIG. 6A illustrates a schematic diagram of a plan layout of the amplification unit 20N in FIG. 5A. The elements and the interconnections illustrated) are connected as the circuit diagram in FIG. 5A within the range in which the arrangement relation in this FIG. 6A is kept. The distances between signal lines and the interconnection lengths of the signal lines satisfy the relations of D<W≤P, L1>P, L2>P, L3<L2, L4<L2, and so on described using FIGS. 2 to 2D. As illustrated in FIG. 6A, the signal line 320 overlaps a plurality of circuits such as the latch circuits 212 and 213 and the control circuits 242 and 243, and is arranged in parallel with the signal line 310 across these circuits. As a result, the interconnection between the signal line 320 and the signal line 310 is readily capacitively coupled. Therefore, the signal line 320 and she signal line 310 that transmits the analog signal SA are capacitively coupled between the interconnection, and the parasitic coupling capacitance Cp readily causes the crosstalk. The influence from the crosstalk can be reduced by converting the judging signal JDG1 output from the determination circuit 22 to the pulse signal PLS1 by the sending circuit 25.

Figure 6B:
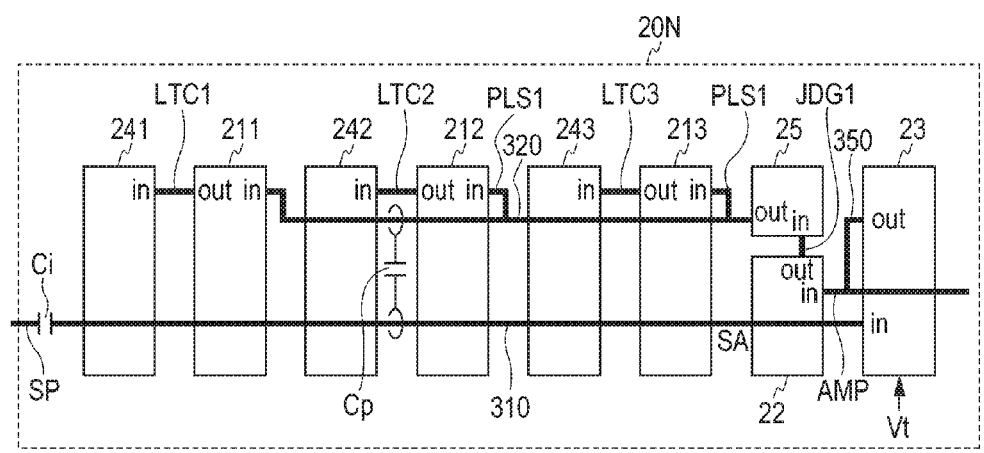

FIG. 6B illustrates a modified example of the schematic diagram of the plan layout of the amplification unit 20N. The positions of the determination circuit 22 and the amplifier 23 are switched in FIG. 6B with respect to FIG. 6A. The effect is similar as in Example 1. Even when the positions of the determination circuit 22 and the latch circuits 211, 212, and 213 are made close as illustrated, the effect of utilizing the pulse signal PLS1 is high in such an example that the signal line 310 and the signal line 320 are arranged in parallel across a plurality of circuit blocks.

As described above, according to Example 2, the judging signal JDG1 is converted to the pulse signal PLS1 and output from the sending circuit 25. Therefore, the influences from the decrease and the increase on the signal level by the crosstalk counteract each other before the A/D conversion period TC. As a result, Example 2 has an effect for reducing n error based on the analog signal SA in the amplification signal AMP in A/D conversion. Such configuration allows suppression of the decrease in the signal accuracy caused by the influence from the crosstalk between the signal lines as well as amplification of the signals by the gain corresponding to the luminance signal level of the pixel.

Example 2 illustrates an example of the amplification unit that feeds back the output of the amplifier to which the present embodiments are applied. However, the present embodiments are also applicable to, for example, an auto gain control (AGC) circuit.

EXAMPLE 3

Figure 7A:
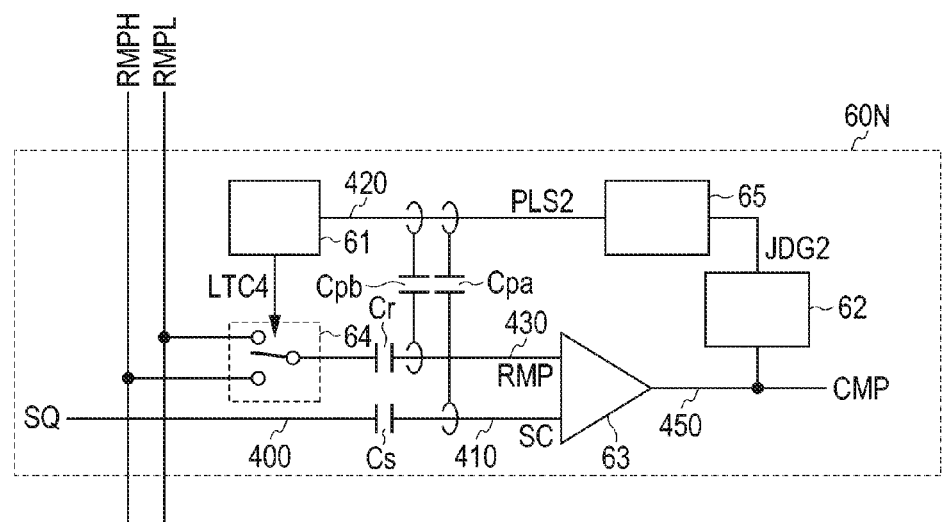
FIGS. 7A and 7B are schematic diagrams describing Example 3 of the semiconductor device.

FIG. 7A illustrates a configuration of a semiconductor device according to Example 3. Example 3 is an example of the comparison portion 600 in Example 1 to which the embodiments mentioned above are applied. FIG. 7A illustrates an example of the comparison unit 60N of the comparison portion 600 to which the present Example 3 is applied, but the present Example 3 can similarly be applied to the comparison units 601, 602, and 609.

The comparison unit 60N includes a latch circuit 61, a determination circuit 62, a comparator 63, a control circuit 64, and a sending circuit 65.

The determination circuit 62 corresponds to the output circuit 41 in FIGS. 2A to 2D. The sending circuit 65 corresponds to the sending circuit 42 in FIGS. 2A to 2D. The comparison unit 60N includes the determination circuit 62 and the sending circuit 65 as the sending unit in FIGS. 2A to 2D. The latch circuit 61 corresponds to the receiving circuit 51 in FIGS. 2A to 2D. The control circuit 64 corresponds to the input circuit 52 in FIGS. 2A to 2D. The comparator 63 includes two input terminals for comparison, and outputs the result of the compared two inputs in binary. The comparison unit 60N includes a comparison circuit that includes the comparator 63. The comparison circuit corresponds to the processing unit 60 in FIGS. 2A to 2D. The comparison unit 60N includes a signal line 410 and a signal line 430 that each correspond to the signal line 31 in FIGS. 2A to 2D, and a signal line 420 that corresponds to the signal line 32 in FIGS. 2A to 2D.

An input signal is input via a signal line 400 connected to a preceding circuit (for example, an amplification unit 20N). The signal line 410 connected to the signal line 400 via a capacitor Cs transmits an analog signal SC based on the input signal SQ. The analog signal SC transmitted by the signal line 410 is input to one input terminal of the comparator 63. The signal line 430 is connected to the other input terminal of the comparator 63. A reference signal RMP that is either a reference signal RMPH or RMPL is input to the signal line 430 via capacitor Cr and the control circuit 64. The control circuit 64 selects which of the reference signals RMPH and RMPL to use. The result of the comparison between the analog signal SC and the reference signal RMP input to the comparator 63 is output as a comparison signal CMP and input to the determination circuit 62.

A pulse signal PLS2 is transmitted by the signal line 420 and input to the latch circuit 61. The pulse signal PLS2 becomes a control signal LTC4 that has been latched by the latch circuit 61, and the control signal LTC4 is transmitted and input to the control circuit 64. The control circuit 64 selects which of the reference signals RMPH and RMPL to be input to the signal line 430 in accordance with the input control signal LTC4. Selection of the reference signal RMPH or RMPL is achieved by the control circuit 64 controlling, by a switch, which signal line to be connected, between a signal line that transmits the reference signal RMPH and a signal line that transmits the reference signal RMPL. The reference signals RMPH and RMPL are analog signals that each in a ramp waveform. The reference signal RMPH has the larger inclination of the ramp waveform than that of the reference signal RMPL. Note that in this configuration, a parasitic coupling capacitance Cpa occurs between the signal lines 410 and 420, and the two signal lines have a relation in which the crosstalk mutually occurs between their interconnection. In addition, a parasitic coupling capacitance Cpb occurs between the signal lines 430 and 420, and the two signal lines have a relation in which the crosstalk mutually occurs between their interconnection.

Figure 7B:
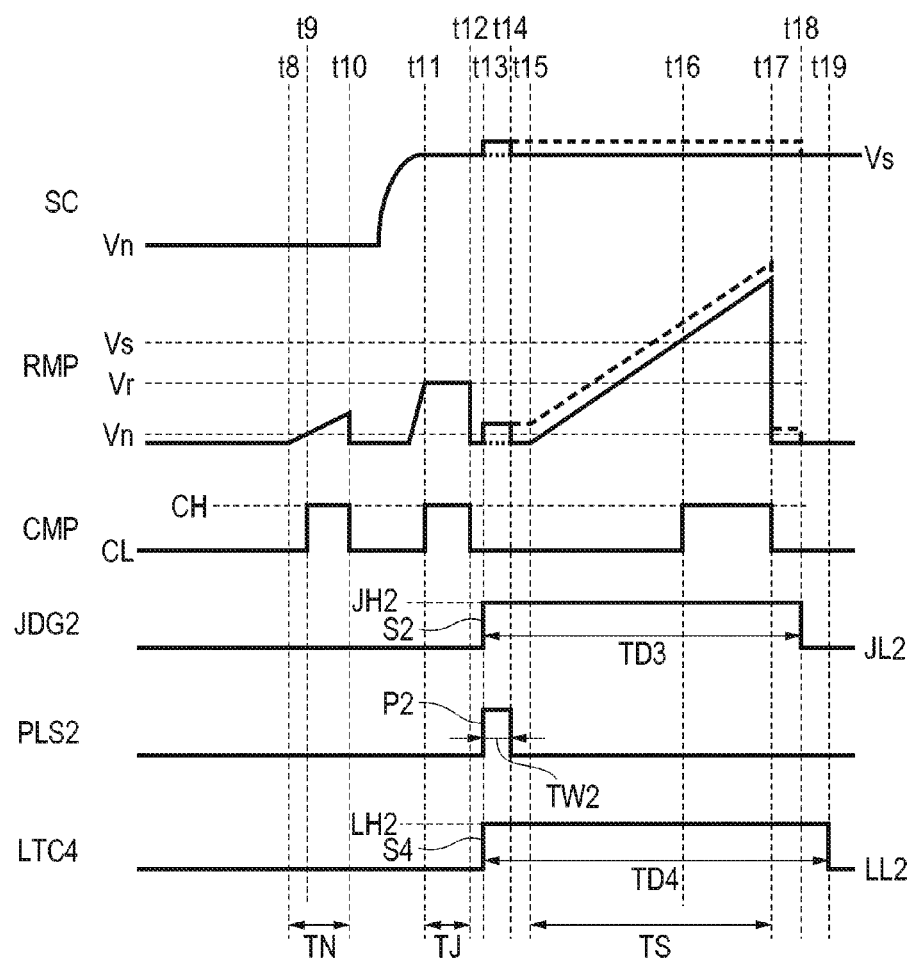

FIG. 7B illustrates a timing chart. A reset level Vn as the analog signal SC is input to the signal line 410 before time t8. The reference signal RMP based on the reference signal RMPH is input to the signal line 430 once an A/D conversion period TN for the reset level Vn starts at time t8. When the reference signal RMP becomes the reset level Vn, the same level as the analog signal SC at time t9, the signal level of the comparison signal CMP changes from a low level CL to a high level CH. When the A/D conversion period TN for the reset level Vn finishes at time t10, the comparison signal CMP returns to the low level CL. A signal corresponding to the luminance level of the pixel is input from the amplification unit 20N, and the analog signal SC becomes statically determinate to a signal level Vs. Then, a luminance judging level Vr included in the reference signal RMPL is input to the reference signal RMP at time t11 and a judging period TJ starts. If the signal level Vs is the same as or higher than the luminance judging level Vr, the comparison signal CMP becomes the high level CH. The judging period TJ finishes at time t12, and the comparison signal CMP then again returns to the low level CL. When the comparison signal CMP is at the high level CH during the judging period TJ, the determination circuit 62 outputs a step S2 to a judging signal. JDG2 from time t13 after the judging period TJ is finished. In the step S2, the level of the judging signal JDG2 changes from a low level JL2 to a high level JH2. Note that if the comparison signal CMP is at the low level CL, the step S2 is not output to the judging signal JDG2. The sending circuit 65 outputs the pulse signal PLS2. The step S2 of the judging signal JDG2 is used as a trigger for the pulse signal PLS2. The judging pulse P2 of the pulse signal PLS2 rises at time t13 and falls at time t14. A pulse width TW2 of the judging pulse P2 is shorter than a duration time TD3 of the high level JH2 in the judging signal JDG2.

The pulse signal PLS2 is transmitted by the signal line 420 and input to the latch circuit 61. The latch circuit 61 latches the judging pulse P2 of the pulse signal PLS2. Then, the latch circuit 61 outputs the latched control signal LTC4. The control circuit 64 selects the reference signal RMPH on the basis of the control signal LTC4.

When an S conversion period TS starts, the ramp waveform of the reference signal RMPH is input to the comparator 63. In the timing chart of FIG. 7B, the reference signal RMPH with a large inclination is input because the control signal LTC4 is at the high level LH2. Note that if the control signal LTC4 is at the low level LL2 during the judging period TJ, the reference signal RMPL with a small inclination is input as the reference signal RMP. When the signal level of the reference signal RMP becomes the signal level Vs, the comparison signal CMP becomes the high level CH from the low level CL. As soon as the S conversion period TS finishes, the comparison signal CMP then again returns to the low level CL.

When the judging pulse P2 of the pulse signal PLS2 rises (at time t13), the signal levels of the analog signal SC and the reference signal RMP increase in accordance with the pulse height of the judging pulse P2, by the coupling capacitance Cpa and Cpb. Also, when the judging pulse P2 of the pulse signal PLS2 falls (at time t14), the signal levels of the analog signal SC and the reference signal RMP reduce in accordance with the pulse height of the judging pulse P2. The rising and the falling of the signal of the analog signal and the reference signal RMP, caused by the crosstalk from the judging pulse P2 of the pulse signal PLS2, counteract each other. As a result, the signal levels become statically determinate close to the original levels before the S conversion period TS.

Broken lines in FIG. 7B illustrate the waveforms of the analog signal SC and the reference signal RMP when determination circuit 62 outputs the judging signal JDG2 to the control circuit 64 via the signal line 420 without using the sending circuit 65 and the latch circuit 61. If the signals are as the illustrated broken lines, the crosstalk occurs in the analog signal SC and reference signal RMP while the judging signal JDG2 is at the high level JH2. As a result, the comparator 63 compares the signals including the crosstalk component in the S conversion period TS.

In the present example, the pulse width TW2 of the judging pulse 22 is made shorter than the duration time TD3 in which the judging signal JDG2 is at the high level JH2, by using the sending circuit 65. Therefore, the A/D conversion starts after the period of the large error on the signal caused by the influence of the crosstalk. As a result, the accuracy of the A/D conversion is improved. In addition, the pulse width TW2 of the judging pulse P2 is made shorter than duration time TD4, which is from the step S4 of the high level LH2 of the control signal LTC4, by using the latch circuit 61. Therefore, the period of the large error on the signal, caused by the influence of the crosstalk, can be shortened. As a result, the accuracy of the A/D conversion is improved.

Figure 8:
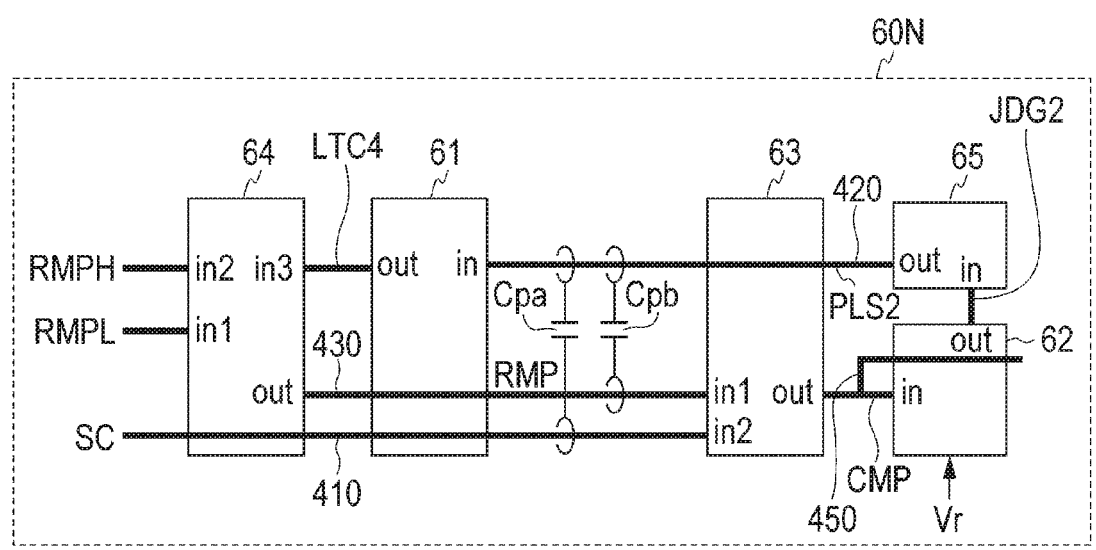
FIG. 8 is a schematic diagram describing Example 3 of the semiconductor device.

FIG. 8 illustrates a schematic diagram of a plan layout of the comparison unit 60N in FIG. 7A. The elements and the interconnections (not illustrated) are connected as FIG. 7A within the range in which the arrangement relation in this FIG. 8 is kept. The distances between signal lines and the interconnection lengths of the signal lines satisfy the relations of D<W≤P, L1>P, L2>P, L3<L2, L4<L2, and so on described using FIGS. 2A to 2D. As illustrated in FIG. 8, the signal line 420 that transmits the judging pulse output from the sending circuit 65 is arranged in parallel with the signal line 410 between the latch circuit 61 and the comparator 63. As a result, capacitive coupling occurs between the signal lines.

Example 3 illustrates an example of the A/D conversion performed by comparing the reference signal including the ramp waveform and the analog signal. However, the present embodiments can also be applied to successive approximation A/D conversion.

According to the embodiments of the present disclosure, a semiconductor device that reduces deterioration of an analog signal can be provided.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2016-016448, filed Jan. 29, 2016, which is hereby incorporated by reference herein in its entirety.

What is claimed is:

1. A semiconductor device in which a plurality of circuit units is arranged in parallel, each of the plurality of circuit units comprising:

a first signal line configured to transmit a first signal which is an analog signal;
a sending unit configured to send a second signal;
a receiving unit configured to receive the second signal; and
a second signal line configured to transmit the second signal from the sending unit to the receiving unit,
wherein
a distance between the first signal line and the second signal line is shorter than pitches at which the plurality of circuit units is arranged,
a sending circuit included in the sending unit outputs the second signal on the basis of an input signal input to the sending circuit,
the input signal is a signal in which a signal level thereof changes from a first signal level to a second signal level, and the second signal is a pulse signal that includes a pulse corresponding to the change of the input signal, and
a width of the pulse is shorter than a duration time of the second signal level of the input signal after the change of the input signal.

2. The semiconductor device according to claim 1, wherein the first signal line is arranged to overlap the receiving unit.

3. The semiconductor device according to claim 1, wherein interconnection lengths of the first and second signal lines are longer than the pitch.

4. The semiconductor device according to claim 1, wherein each of the plurality of circuit units comprises
a processing unit to which the first signal is input, the processing unit being configured to output a signal corresponding to the first signal.

5. The semiconductor device according to claim 1, wherein each of the plurality of circuit units comprises
a processing unit to which the first signal is input, the processing unit being configured to output a signal corresponding to the first signal, and the receiving unit includes a circuit configured to generate the input signal on the basis of the signal output from the processing unit.

6. The semiconductor device according to claim 1, wherein each of the plurality of circuit units includes an amplifier, and
the receiving unit includes a circuit configured to control a gain for the amplifier.

7. The semiconductor device according to claim 6, wherein the sending unit includes a circuit configured to generate the input signal on the basis of the output of the amplifier.

8. The semiconductor device according to claim 1, further comprising a pixel portion in which a plurality of pixel circuits is arranged,
wherein the first signal is based on a pixel signal output from the pixel portion.

9. The semiconductor device according to claim 1, wherein the semiconductor device generates a digital signal based on the first signal.

10. A semiconductor device in which a plurality of circuit units is arranged in parallel, each of the plurality of circuit units comprising:
a first signal line configured to transmit a first signal which is an analog signal;
a sending unit configured to send a second signal;
a receiving unit configured to receive the second signal; and a second signal line configured to transmit the second
   signal from the sending unit to the receiving unit,
wherein
a distance between the first signal line and the second
   signal line is shorter than pitches at which the plurality
   of circuit units is arranged,
a receiving circuit included in the receiving unit outputs
   a third signal on the basis of the second signal,
the second signal is a pulse signal that includes a pulse,
   and the third signal is a signal in which a signal level
   thereof changes, corresponding to the pulse, from a first
   signal level to a second signal level, and
a width of the pulse is shorter than a duration time of the
   second signal level of the third signal after the change
   of the third signal.

11. The semiconductor device according to claim 10, wherein a sending circuit included in the sending unit outputs the second signal on the basis of the an input signal input to the sending circuit,
   the input signal is the signal in which the signal level thereof changes from a third signal level to a fourth signal level, and the second signal is a pulse signal that includes a pulse corresponding to the change of the input signal, and
   the width of the pulse is shorter than the duration time of the fourth signal level of the input signal after the change of the input signal.

12. The semiconductor device according to claim 10, wherein the receiving circuit is a latch circuit.

13. The semiconductor device according to claim 10, wherein the receiving circuit configured to output the third signal is a first receiving circuit, and the receiving unit that includes the first receiving circuit is a first receiving unit, and
   each of the plurality of circuit units comprises
   a second receiving unit configured to receive the second signal via the second signal line,
   the second receiving unit includes a second receiving circuit configured to output a fourth signal on the basis of the second signal, and the fourth signal is a signal in which the signal level thereof changes, according to the pulse, from a signal level to another signal level, and
   the width of the pulse is shorter than a duration time of the another signal level of the fourth signal after the change of the fourth signal.

14. The semiconductor device according to claim 13, wherein the second signal line is arranged to overlap the second receiving unit.

15. The semiconductor device according to claim 10, wherein an interconnection length of the second signal line is longer than an interconnection length of a third signal line configured to transmit the third signal.

16. The semiconductor device according to claim 10, wherein the receiving unit includes a control circuit configured to control a switch on the basis of the third signal.

17. The semiconductor device according to claim 10, wherein each of the plurality of circuit units includes a comparator, and
   the receiving unit includes a circuit configured to select a reference signal to be input to the comparator.

18. The semiconductor device according to claim 17, wherein the sending unit includes a circuit configured to generate the input signal on the basis of the output of the comparator.

19. A semiconductor device in which a plurality of circuit units is arranged in parallel,
   each of the plurality of circuit units comprising:
   a first signal line configured to transmit a first signal;
   a sending unit including a first circuit and configured to send a second signal;
   a receiving unit including a second circuit and configured to receive the second signal; and
   a second signal line configured to transmit the second signal from the sending unit to the receiving unit,
wherein
   the first signal is an analog signal and the second signal is a digital signal,
   a distance between the first signal line and the second signal line is shorter than pitches at which the plurality of circuit units is arranged, and
   the receiving unit includes a latch circuit to which the second signal is input, the latch circuit being configured to output a third signal.

20. An electronic apparatus comprising:
   a semiconductor device comprising
      a plurality of circuit units is arranged in parallel, each of the plurality of circuit units comprising:
      a first signal line configured to transmit a first signal which is an analog signal;
      a sending unit configured to send a second signal;
      a receiving unit configured to receive the second signal; and
      a second signal line configured to transmit the second signal from the sending unit to the receiving unit,
   wherein
   a distance between the first signal line and the second signal line is shorter than pitches at which the plurality of circuit units is arranged,
   a sending circuit included in the sending unit outputs the second signal on the basis of an input signal transmitted to the sending circuit,
   the input signal is a signal in which a signal level thereof changes from a first signal level to a second signal level, and the second signal is a pulse signal that includes a pulse corresponding to the change of the input signal, and
   the width of the pulse is shorter than a duration time of the second signal level of the input signal after the change of the input signal; and
   a signal processing device configured to process a signal output from the semiconductor device.

* * * * *